United States Patent

Roh

[11] Patent Number: 6,061,295
[45] Date of Patent: May 9, 2000

[54] INTEGRATED CIRCUIT MEMORY DEVICES HAVING TIME COMPENSATED COLUMN SELECTION CAPABILITY FOR IMPROVING WRITE OPERATION RELIABILITY

[75] Inventor: Jae-gu Roh, Kyungki-do, Rep. of Korea

[73] Assignee: Samsung Electronics Co., Ltd., Rep. of Korea

[21] Appl. No.: 09/123,121

[22] Filed: Jul. 27, 1998

[30] Foreign Application Priority Data

Nov. 7, 1997 [KR] Rep. of Korea ............ 97-58796

[51] Int. Cl.[7] ........................................ G11C 8/00
[52] U.S. Cl. ............... 365/233; 365/194; 365/230.06
[58] Field of Search ............................ 365/233, 194, 365/230.06

[56] References Cited

U.S. PATENT DOCUMENTS 5,812,464  9/1998  Kim ........................... 365/194

Primary Examiner—A. Zarabian
Attorney, Agent, or Firm—Myers Bigel Sibley & Sajovec

[57] ABSTRACT

Integrated circuit memory devices having time compensated column selection capability include a column selection signal controller which performs the functions of generating: a control signal during read and write modes of operation, a read column selection enable signal based on the control signal during the read mode of operation and a write column selection enable signal based on a delayed version of the control signal during the write mode of operation, in response to a clock signal. Using this controller, the delay between generation of the control signal and the write column selection enable signal is greater than the delay between generation of the control signal and the read column selection enable signal. This greater delay provides a greater data access time (e.g., setup time) during write operations and thereby improves the reliability of these write operations by enabling data lines to become sufficiently charged and enabling sufficient time for data transfer between input/output lines and bit lines of a memory cell array, such as a DRAM array. A column selection circuit is also provided and this decoder is responsive to a column address and the read and write column selection enable signals. The memory cell array is electrically coupled by a sense amplifier to the column decoder.

20 Claims, 3 Drawing Sheets

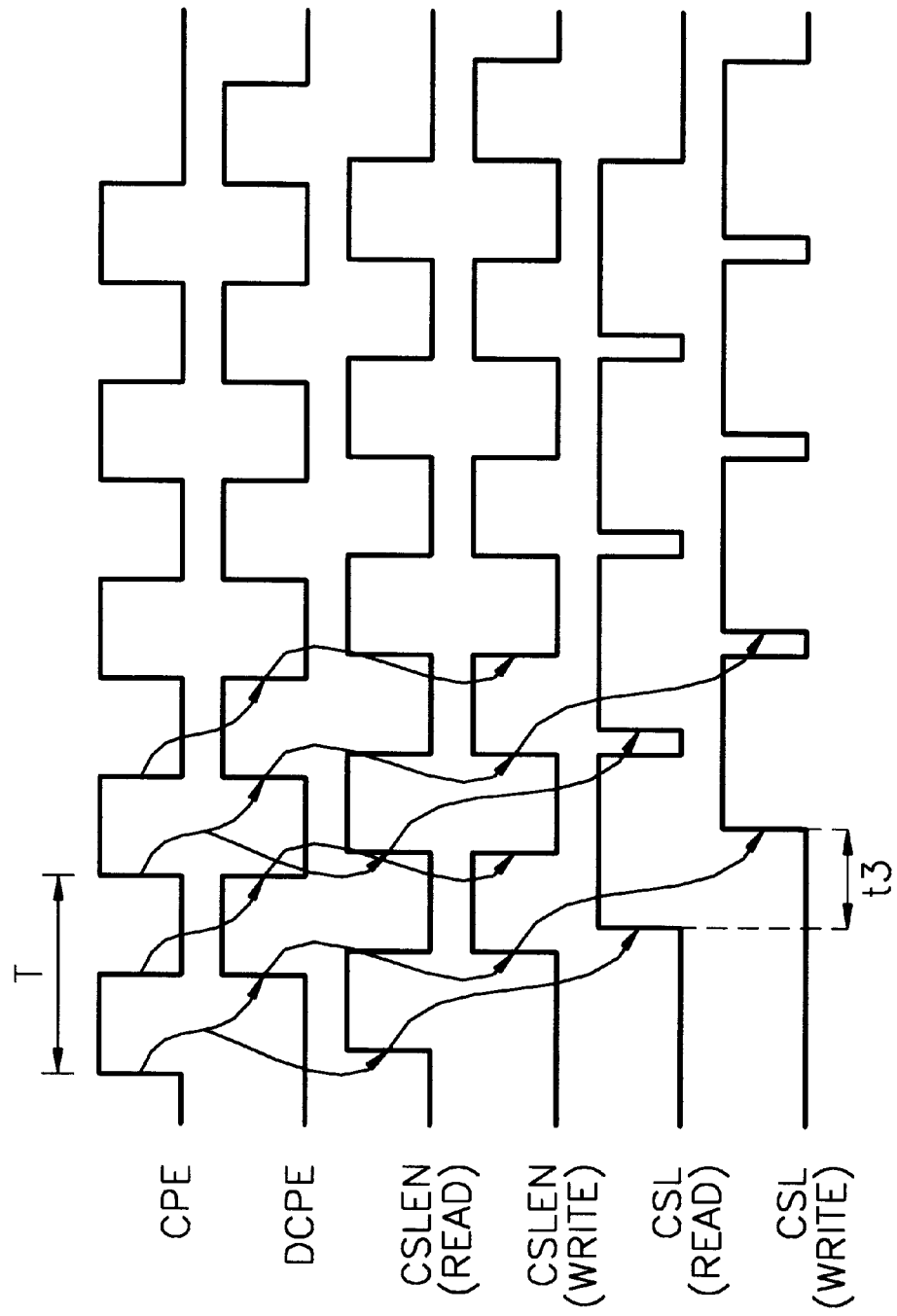

INTEGRATED CIRCUIT MEMORY DEVICES HAVING TIME COMPENSATED COLUMN SELECTION CAPABILITY FOR IMPROVING WRITE OPERATION RELIABILITY

FIELD OF THE INVENTION

The present invention relates to integrated circuit memory devices and more particularly, to integrated circuit memory devices having column select circuits therein.

BACKGROUND OF THE INVENTION

Many integrated circuit memory devices include a plurality of banks of memory cells and column decoders therein which facilitate operations to write and read data to and from the banks of memory cells. As will be understood by those skilled in the art, such column decoders are typically responsive to a column address and a column selection control/enable signal which can be generated by a column selection signal controller. Block selectors may also be utilized to electrically couple an input/output bus to a respective column decoder. Such conventional multi-bank integrated circuit memory devices are more fully described at section 10.2.2 of a textbook by Jan M. Rabaey, entitled "Digital Integrated Circuits: A Design Perspective", Prentice-Hall, Inc. (1996).

FIG. 1 illustrates a conventional column selection signal controller having an input buffer 101, a pulse generator 103 and an output buffer 105 coupled in series. FIG. 2 is a timing diagram which illustrates operation of the signal controller of FIG. 1. The input buffer 101, which may comprise first and second serially connected inverters 121–122, receives a clock signal CLK at its input and generates an input control signal CPE at its output. The pulse generator 103 includes third through seventh inverters 123–127 and a NAND gate 131 having first and second inputs connected to an output of the seventh inverter 127 and the output of the second inverter 122. As will be understood by those skilled in the art, a series of 0→1 transitions by the input control signal CPE will cause the pulse generator 103 to generate a series of 1→0→1 pulses as signal CP. These pulses have a duration equal to the combined delay of the third through seventh inverters 123–127. The duration of each pulse is equal to t2, as illustrated by FIG. 2 and the duration t1+t2 equals the period of the clock signal CLK. The output buffer 105 includes eighth and ninth inverters 128–129 and generates a column selection enable signal CSLEN at its output.

As will be understood by those skilled in the art, read and write operations may be enabled when the column selection enable signal CSLEN is set to a logic 1 state and disabled when the column selection enable signal CSLEN returns to a logic 0 state. Thus, the duration t1 may determine the maximum available data access time during both read and write operations. Unfortunately, as integrated circuit memory devices are pushed to operate at higher and higher clock frequencies, the duration t1 may be sufficiently long to enable reliable reading of data from a column decoder, but not sufficiently long to enable reliable writing of data through a column decoder to a bank of memory cells coupled thereto. Such unreliability may be particularly severe when double data rate synchronous dynamic random access memory devices are employed. Thus, notwithstanding the above described integrated circuit memory devices, there continues to be a need for improved integrated circuit memory devices.

SUMMARY OF THE INVENTION

It is therefore an object of the present invention to provide improved integrated circuit memory devices and methods of operating same.

It is another object of the present invention to provide integrated circuit memory devices having circuits therein which provide sufficient data access time during both reading and writing operations, and methods of operating same.

These and other objects, features and advantages of the present invention are provided by integrated circuit memory devices which have the capability of providing a data access time during a write operation which is greater than a data access time associated with a read operation. In particular, according to one embodiment of the present invention, a column selection signal controller is provided which is responsive to a clock signal CLK and performs the functions of generating a control signal during read and write modes of operation, a read column selection enable signal based on the control signal during the read mode of operation and a write column selection enable signal based on a delayed version of the control signal during the write mode of operation. Using this controller, the delay between generation of the control signal and the write column selection enable signal is greater than the delay between generation of the control signal and the read column selection enable signal. This greater delay provides a greater data access time (e.g., setup time) during write operations and thereby improves the reliability of these write operations by enabling data lines to become sufficiently charged and enabling sufficient time for data transfer between input/output lines and bit lines of a memory cell array, such as a DRAM array. A column decoder is also provided and this decoder is responsive to a column address and the read and write column selection enable signals. The memory cell array is electrically coupled by a sense amplifier to the column decoder.

According to a preferred aspect of the present invention, the control signal CPE is generated at the output of a buffer which receives the clock signal CLK and the column selection signal controller contains a first logic device which is responsive to the control signal, a memory bank select signal BA, a column address enable signal $\phi$YE and an inverted version of a write control signal $\phi$WRB. This first logic device generates a read column selection enable signal RCSLEN. The column selection signal controller also contains a second logic device which is responsive to the delayed version of the control signal, the memory bank select signal BA, the column address enable signal $\phi$YE and the write control signal $\phi$WR. This second logic device generates a write column selection enable signal WCSLEN. Here, the delayed version of the control signal is generated by a delay circuit which preferably comprises a delay-locked loop or phase-locked loop. The delay circuit preferably provides a delay which is equal to one-half a period (T) of the control signal CPE. A third logic device is also provided for passing the output of the first logic device as the read column selection enable signal RCSLEN and passing the output of the second logic device as the write column selection enable signal WCSLEN, during nonoverlapping time intervals. The output of the third logic device is the output of the column selection signal controller. This output is electrically coupled to an input of the column decoder. A column address CAi signal line is also electrically coupled to another input of the column decoder.

BRIEF DESCRIPTION OF THE DRAWINGS

FIG. 4 is a timing diagram which illustrates operation of the memory device of FIG. 3.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
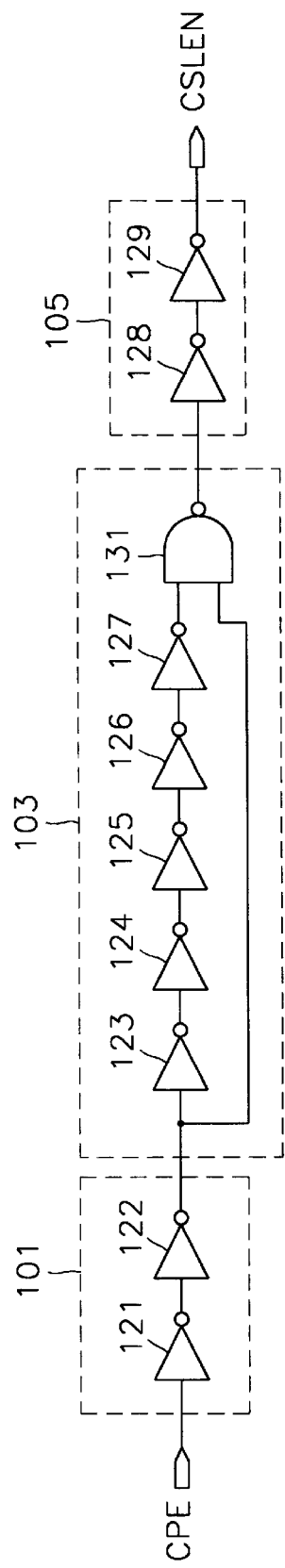
FIG. 1 is an electrical schematic of a column selection signal controller according to the prior art.
Figure 2:
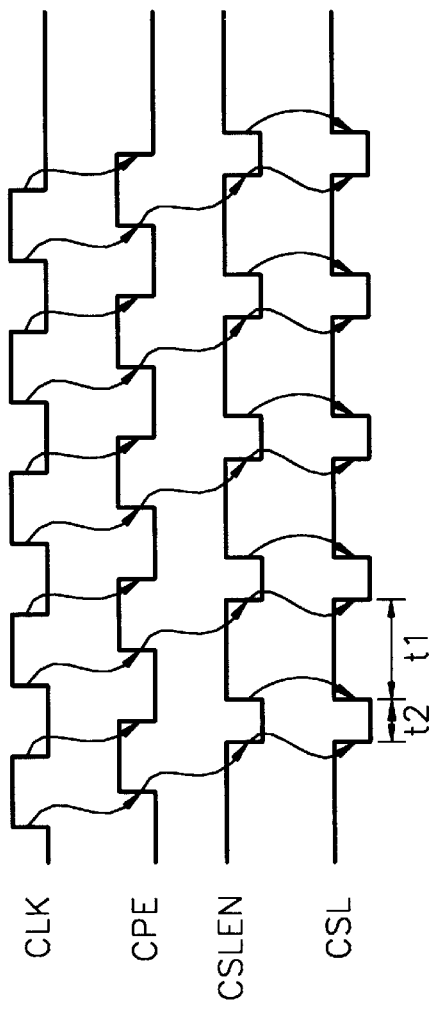
FIG. 2 is a timing diagram which illustrates operation of the column selection signal controller of FIG. 1.
Figure 3:
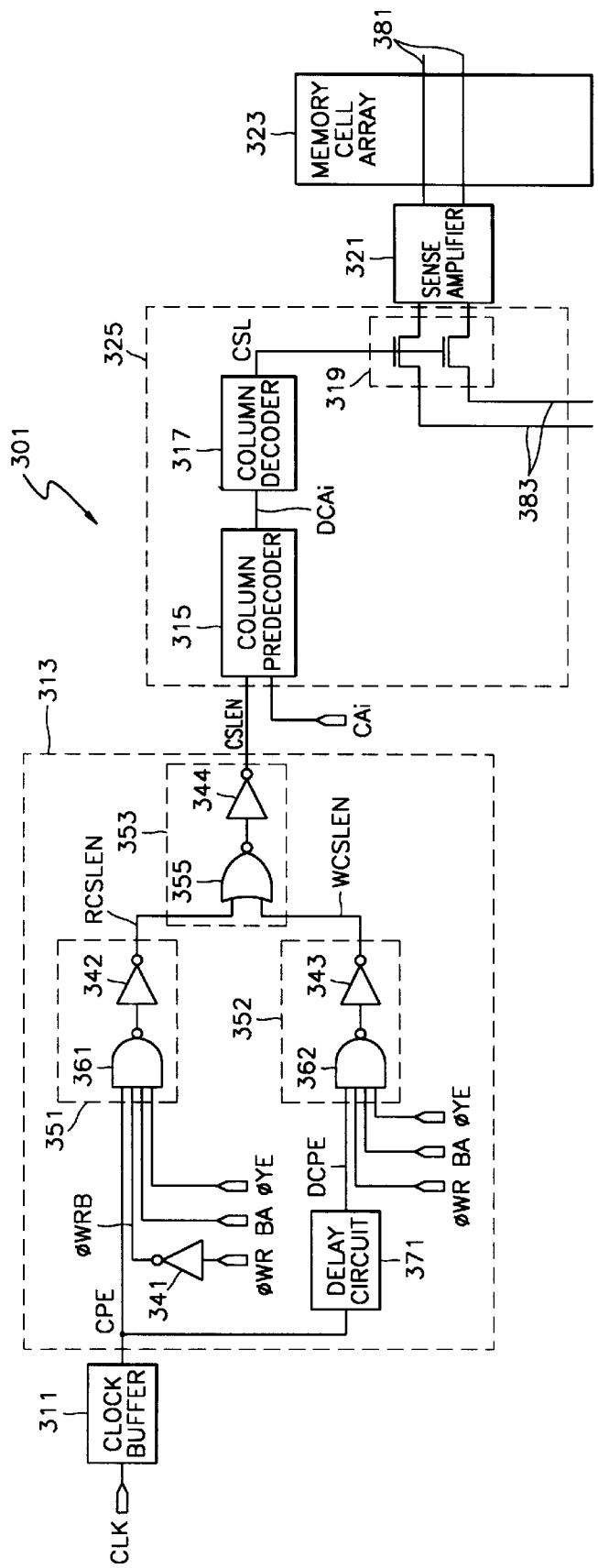
FIG. 3 is an electrical schematic of an integrated circuit memory device according to a preferred embodiment of the present invention.

Referring now to FIG. 3, an integrated circuit memory device 301 according to a preferred embodiment of the present invention will be described. This preferred integrated circuit memory device 301 includes a column selection signal controller 313, a column selection circuit 325, a sense amplifier 321 and at least one memory cell array 323 (e.g., DRAM array). A plurality of pairs of differential input/output lines 383 may be electrically coupled through the column selection circuit 325 to the sense amplifier 321. The sense amplifier 321 may also be electrically coupled to a plurality of pairs of differential bit lines 381 which extend from the memory cell array 323. The construction and operation of a preferred sense amplifier 321 may be as disclosed in U.S. Pat. No. 5,701,268 to Lee et al. entitled "Sense Amplifier for Integrated Circuit Memory Devices Having Boosted Sense and Current Drive Capability and Methods of Operating Same", assigned to the assignee of the present application, the disclosure of which is hereby incorporated herein by reference. The column selection circuit 325 may also perform functions similar to those of the column selection circuit described in U.S. Pat. Nos. 5,748,529 to Lee entitled "Integrated Circuit Memory Devices Having Direct Read Capability" and U.S. Pat. No. 5,761,132 to Kim entitled "Integrated Circuit Memory Devices with Latch-Free Page Buffers Therein for Preventing Read Failures", assigned to the assignee of the present application, the disclosures of which are hereby incorporated herein by reference. As illustrated, the column selection circuit 325 includes a column predecoder 315 which is responsive to a column address CAi and a column selection enable signal CSLEN. The construction and operation of column predecoder 315 is well known to those skilled in the art and need not be described further herein. The column predecoder 315 generates a predecoded column address DCAi. This predecoded column address DCAi is supplied as an input to a column decoder 317 of conventional design. The column decoder 317 is capable of generating a plurality of column select signals CSL and each of these column select signals CSL may be provided to corresponding pairs of pass transistors 319. By turning on these pass transistors 319, the differential input/output lines 383 may become electrically connected to input lines of the sense amplifier 321.

The column selection signal controller 313 receives as an input a control signal CPE which may be generated at the output of a clock buffer 311. As illustrated, the clock buffer 311 receives a clock signal CLK as an input. Accordingly, the control signal CPE may be a buffered version of the clock signal CLK and, therefore, slightly delayed in time relative to the clock signal CLK. First, second and third logic devices 351–353 are also provided with the column selection signal controller 313. The first logic device 351 may include a multi-input NAND gate 361 coupled to an inverter 342. Thus, the first logic device 351 may perform the boolean function of an AND gate. Similarly, the second logic device 352 may include a multi-input NAND gate 362 coupled to an inverter 343. Accordingly, like the first logic device 351, the second logic device 352 may also perform the boolean function of an AND gate. As illustrated, the outputs of the first and second logic devices 351–352 are electrically coupled to respective inputs of a third logic device 353. The third logic device 353 may include a dual-input NOR gate 355 coupled to an inverter 344. Thus, the third logic device 353 may perform the boolean function of an OR gate. The output of the third logic device 353 is electrically coupled to an output of the column selection signal controller 313 which generates a column selection enable signal CSLEN. This column selection enable signal CSLEN may be either a read column selection enable signal RCSLEN generated by the first logic device 351 or a write column selection enable signal WCSLEN generated by the second logic device 352. As described more fully hereinbelow, these read and write column selection enable signals may be generated during corresponding read and write modes of operation.

Referring still to the column selection signal generator 313 of FIG. 3, the first logic device 351 may receive a plurality of input signals. According to one aspect of the present invention, these input signals to the first logic device 351 may include the control signal CPE, an inverted version of a write control signal φWRB, a bank select signal BA (in the event the memory device 301 includes multiple banks of memory (e.g., multiple memory cell arrays)), and a column address enable signal φYE. The second logic device 352 may also receive a delayed version of the control signal CPE, a write control signal φWR, the bank select signal BA and the column address enable signal φYE. Here, the delayed version of the control signal DCPE may be generated by a delay circuit 371. This delay circuit 371 may be selected from the group consisting of a delay-locked loop or a phase-locked loop. The delay provided by the delay circuit 371 is preferably equal to one-half the period (T) of the control signal CPE.

Accordingly, during a read mode of operation (i.e., when data is being transferred from the bit lines 381 to the input/output lines 383), the simultaneous occurrence of a logic 1 column address enable signal φYE, a logic 1 bank select signal BA and a logic 0 write control signal φWR at the time the control signal CPE undergoes a 0→1 transition, will cause the generation of a logic 1 read column selection enable signal RCSLEN at the output of the column selection signal controller 313. In contrast, during a write mode of operation, the simultaneous occurrence of a logic 1 column address enable signal φYE, a logic 1 bank select signal BA and a logic 1 write control signal φWR at the time the output of the delay circuit 371 (e.g., DCPE) undergoes a 0→1 transition, will cause the generation of a write column selection enable signal WCSLEN at the output of the column selection signal controller 313. Thus, relative to the read column selection enable signal RCSLEN, the occurrence of a 0→1 transition in the control signal CPE during a write mode of operation will cause the generation of a delayed write column selection enable signal WCSLEN.

Referring now to FIG. 4, a timing diagram which illustrates operation of the memory device of FIG. 3 is provided. As illustrated by FIG. 4, the generation of a control signal CPE results in the generation of a delayed control signal DCPE at the output of the delay circuit 371. Here, the delay is illustrated as being equal to one-half the period (T) of the control signal CPE. During the read mode of operation, the column selection enable signal CSLEN generated at the output of the column selection signal controller 313 is a slightly delayed version of the control signal CPE, however, during the write mode of operation, the column selection enable signal CSLEN is a substantially delayed version of the control signal CPE. Accordingly, the delay "t3" between the 0→1 transition of the column select signal CSL in the write versus read mode of operation, represents the additional data access time which can be provided when writing data to the memory cell array 323.

Thus, integrated circuit memory devices of the present invention have the capability of providing a data access time during a write operation which is longer in duration than a data access time associated with a read operation. In particular, by using the preferred column selection signal controller 313, the delay between generation of the control signal and the write column selection enable signal WCSLEN during a write mode of operation is greater than the delay between generation of the control signal and the read column selection enable signal RCSLEN during a read mode of operation. This greater delay provides a greater data access time (e.g., setup time) during write operations and thereby improves the reliability of these write operations by enabling data lines (e.g., those connected to the sense amplifier 321) to become sufficiently precharged and enabling sufficient time for data transfer between the input/output lines 383 and the bit lines 381 of the memory cell array 323.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   means, responsive to a clock signal, for generating a control signal during read and write modes of operation, a read column selection enable signal that is in-sync with the control signal during the read mode of operation and has a leading edge delayed relative to a leading edge of the control signal by a first delay and a write column selection enable signal that is in-sync with the control signal during the write mode of operation, has a duty cycle equal to a duty cycle of the read column selection enable signal and has a leading edge delayed relative to the leading edge of the control signal by a second delay greater than the first delay;
   a column selection circuit responsive to a column address and the read and write column selection enable signals; and
   a memory cell array electrically coupled to said column selection circuit.

2. The memory device of claim 1, wherein said generating means is responsive to a bank select signal and a column address enable signal.

3. The memory device of claim 2, wherein said generating means is responsive to a write control signal during the read and write modes of operation; wherein the control signal has a period of T; and wherein the read and write column selection enable signals are out-of-phase relative to each other by ½T.

4. The memory device of claim 3, wherein the write column selection enable signal can only be generated when the write control signal is in a first logic state and the read column selection enable signal can only be generated when the write control signal is in a second logic state, opposite the first logic state.

5. The memory device of claim 2, wherein said generating means comprises:
   a first logic device responsive to the control signal, the bank select signal and the column address enable signal;
   a second logic device responsive to the delayed version of the control signal, the bank select signal and the column address enable signal; and
   a third logic device which passes an output of the first logic device as the read column selection enable signal and passes an output of the second logic device as the write column selection enable signal.

6. The memory device of claim 5, wherein the first and second logic devices each perform the boolean function of an AND gate and the third logic device performs the boolean function of an OR gate.

7. The memory device of claim 1, wherein said generating means comprises:
   a first logic device responsive to the control signal, a bank select signal and a column address enable signal;
   a second logic device responsive to the delayed version of the control signal, the bank select signal and the column address enable signal; and
   a third logic device which passes an output of the first logic device as the read column selection enable signal and passes an output of the second logic device as the write column selection enable signal.

8. The memory device of claim 7, wherein the first and second logic devices each perform the boolean function of an AND gate and the third logic device performs the boolean function of an OR gate.

9. The memory device of claim 8, wherein the second logic device is responsive to a write control signal; and wherein the first logic device is responsive to a complementary version of the write control signal.

10. The memory device of claim 1, wherein said generating means comprises a delay circuit selected from the group consisting of a delay-locked loop and a phase-locked loop.

11. The memory device of claim 10, wherein the delay circuit provides a delay equal to one-half a period of the control signal.

12. The memory device of claim 1, further comprising a sense amplifier electrically coupled between said column selection circuit and said memory cell array.

13. An integrated circuit memory device, comprising:
   a memory cell array having a plurality of pairs of differential bit lines which receive data during read and write modes of operation;
   a sense amplifier electrically coupled to said plurality of pairs of differential bit lines;
   a column selection signal controller that is responsive to a control signal and generates a read column selection enable signal that is in-sync with the control signal during a read mode of operation and has a leading edge delayed relative to a corresponding leading edge of the control signal by a first delay and a write column selection enable signal that is in-sync with the control signal during a write mode of operation, has a duty cycle equal to a duty cycle of the read column selection enable signal and has a leading edge delayed relative to a corresponding leading edge of the control signal by a second delay greater than the first delay; and a column selection circuit electrically coupled to said sense amplifier, said column selection circuit responsive to a column address and the read and write column selection enable signals.

14. The memory device of claim 13, wherein said generating means is responsive to a write control signal during the read and write modes of operation; wherein the control signal has a period of T; and wherein the read and write column selection enable signals are out-of-phase relative to each other by ½T.

15. The memory device of claim 14, wherein the write column selection enable signal is generated when the write control signal is in a first logic state and the read column selection enable signal is generated when the read control signal is in a second logic state, opposite the first logic state.

16. The memory device of claim 15, wherein said generating means comprises:

a first logic device responsive to the control signal, a bank select signal and a column address enable signal;

a second logic device responsive to the delayed version of the control signal, the bank select signal and the column address enable signal; and a third logic device which passes an output of the first logic device as the read column selection enable signal and passes an output of the second logic device as the write column selection enable signal.

17. The memory device of claim 13, wherein said generating means comprises a delay circuit which generates the delayed version of the control signal, said delay circuit selected from the group consisting of a delay-locked loop and a phase-locked loop.

18. The memory device of claim 17, wherein said delay circuit provides a delay equal to one-half a period of the control signal.

19. The memory device of claim 16, wherein the first and second logic devices each perform the boolean function of an AND gate and the third logic device performs the boolean function of an OR gate.

20. In an integrated circuit memory device containing a memory cell array and a column selection circuit electrically coupled to the memory cell array, a method of writing and reading data to and from the memory cell array during a write and read cycle, respectively, said method comprising the steps of:

generating a control signal;

providing the column selection circuit with a read column address and a read column selection enable signal which is based on the control signal, during the read cycle; and providing the column selection circuit with a write column address and a write column selection enable signal which is based on a delayed version of the control signal and has a duty cycle equal to a duty cycle of the read column selection enable signal, during the write cycle.

* * * * *

UNITED STATES PATENT AND TRADEMARK OFFICE
CERTIFICATE OF CORRECTION

Page 1 of 1

PATENT NO. : 6,061,295
DATED : May 9, 2000
INVENTOR(S) : Jae-gu Roh

It is certified that error appears in the above-identified patent and that said Letters Patent is hereby corrected as shown below:

Column 6,
Lines 42-45, please delete and substitute the following:
  10. The memory device of claim 1, wherein said generating means comprises a delay-locked loop or a phase-locked loop.

Column 7,
Line 17, please delete "read" and substitute -- write -- therefor.

Signed and Sealed this

Seventeenth Day of July, 2001

*Attest:*

NICHOLAS P. GODICI
*Attesting Officer*        *Acting Director of the United States Patent and Trademark Office*